(12) United States Patent
Möckel et al.

(10) Patent No.: US 6,302,729 B2
(45) Date of Patent: Oct. 16, 2001

(54) INTEGRATED CIRCUIT WITH ELECTRICAL CONNECTION POINTS THAT CAN BE SEVERED BY THE ACTION OF ENERGY

(75) Inventors: Jens Möckel, Dresden; Robert Feurle, Neubiberg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/776,954

(22) Filed: Feb. 5, 2001

Related U.S. Application Data

(63) Continuation of application No. PCT/DE99/02398, filed on Aug. 2, 1999.

(30) Foreign Application Priority Data

Aug. 4, 1998 (DE) .............................................. 198 35 263

(51) Int. Cl.[7] .............................. H01R 27/00; H01R 29/00
(52) U.S. Cl. ............................................................ 439/516
(58) Field of Search .................................... 439/516, 163, 439/152, 154, 180, 188, 189, 507, 923; 365/225.7; 257/209, 259

(56) References Cited

U.S. PATENT DOCUMENTS

| | | | | |
|---|---|---|---|---|
| 4,471,158 | * | 9/1984 | Roberts | 439/516 |
| 5,508,938 | * | 4/1996 | Wheeler | 364/448 |
| 5,585,675 | * | 12/1996 | Knopf | 257/774 |
| 5,623,160 | * | 4/1997 | Liberkowski | 257/621 |
| 5,636,172 | | 6/1997 | Prall et al. . | |
| 6,198,118 | * | 3/2001 | Holcombe | 257/292 |
| 6,236,442 | * | 5/2001 | Stephenson et al. | 349/142 |

FOREIGN PATENT DOCUMENTS

| | | |
|---|---|---|
| 0 720 229 A2 | 7/1996 | (EP) . |
| 1080037 | 3/1989 | (JP) . |
| 05029467 | 2/1993 | (JP) . |
| 06120349 | 4/1994 | (JP) . |
| 06310603 | 11/1994 | (JP) . |

\* cited by examiner

Primary Examiner—Tulsidas Patel
Assistant Examiner—Chandrika Prasad
(74) Attorney, Agent, or Firm—Herbert L. Lerner; Laurence A. Greenberg; Werner H. Stemer

(57) ABSTRACT

An integrated circuit includes electrical conductor tracks adjacently disposed parallel to one another and running substantially in a first direction. The tracks have at least three electrical connection points that can be severed by energy. The connection points are offset with respect to one another both in the first direction and in a second direction at right angles thereto. A central connection point is disposed between two outer connection points viewed in both directions. The connection points are a constituent part of a central or of an outer conductor track. The central and outer tracks are disposed parallel to one another and run substantially in the first direction. Each outer conductor track has, at the level of the central connection point, an offset facing away from the latter and, at the level of the outer connection point of the respective other outer conductor track, an offset facing the latter. The central conductor track has, at the level of the two outer connection points, a respective offset facing away from the latter.

5 Claims, 2 Drawing Sheets

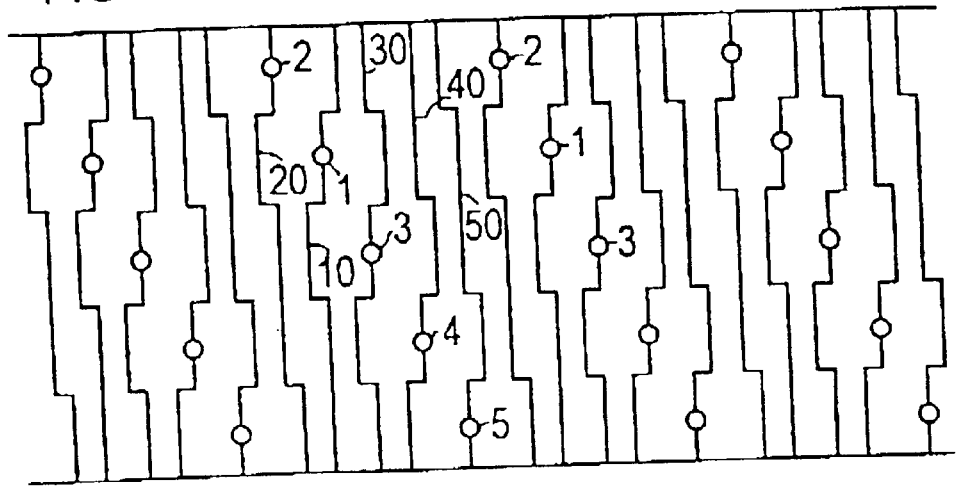
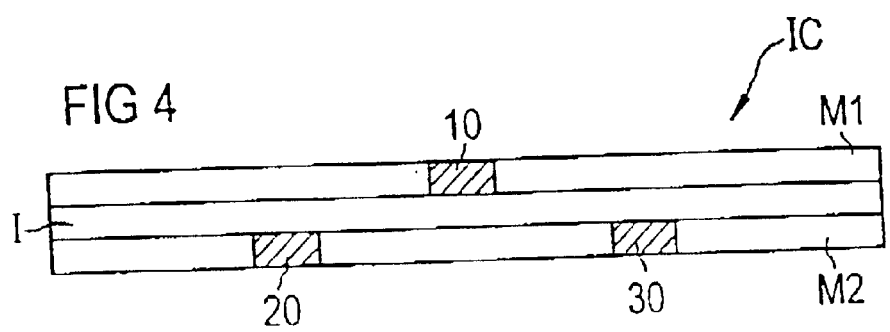

INTEGRATED CIRCUIT WITH ELECTRICAL CONNECTION POINTS THAT CAN BE SEVERED BY THE ACTION OF ENERGY

CROSS-REFERENCE TO RELATED APPLICATION

This application is a continuation of copending International Application No. PCT/DE99/02398, filed Aug. 2, 1999, which designated the United States.

BACKGROUND OF THE INVENTION

Field of the Invention

The invention lies in the field of integrated circuits. The invention relates to an integrated circuit with electrical connection points that can be severed by the action of energy, also called fuse links.

Japanese Patent Abstract JP-A 01-080 037 discloses an integrated circuit with fuse links, for example. The Abstract shows two rows disposed parallel to one another and each having two fuse links. Each fuse link is an element of an electrical conductor track, the conductor tracks of each row being parallel to one another and rectilinear. Depending on their type, fuse links can be severed, for example, by increased currents flowing through the respective conductor track or by a laser beam. Depending on whether or not a fuse link has been severed, two different states can be distinguished. As such, it is possible to configure an integrated circuit through the fuse links.

In practice, it is often necessary to provide a large number of fuse links on the integrated circuit. Many fuse links are then disposed in a row with the conductor tracks connected to the links being aligned parallel to one another and running rectilinearly. When the fuse links are severed, in particular, by a laser beam, the insulating layer disposed above the fuse link is destroyed. Because the fuse link's electrically conductive material is distributed on the integrated circuit alongside the severing point during the severing, to some extent in an uncontrolled manner, it is necessary to maintain certain minimum spacings between adjacent fuse links to prevent the creation of short circuits between the adjacent fuse links by the aforementioned contaminants. Because of the positioning inaccuracy and the limited minimum beam diameter of the laser system that can be used, the result is likewise determined minimum spacings. The minimum spacings predefined in this way result in a considerable space requirement for large numbers of fuse links disposed in a row.

U.S. Pat. No. 5,636,172 to Prall et al. describes a bank of electrical connection points that can be severed by a laser. The connection points (fuses) are constituent parts of conductor tracks. The connection points are disposed offset with respect to one another in two directions at right angles to each other. The conductor tracks run substantially parallel to one another in a first direction. In each case, three connection points and three sections not having any connection points are located beside one another. In sections having three connection points running parallel to one another, there is a greater spacing of the conductor tracks from one another than in sections not having any connection points.

SUMMARY OF THE INVENTION

It is accordingly an object of the invention to provide an integrated circuit with electrical connection points that can be severed by the action of energy that overcomes the hereinafore-mentioned disadvantages of the heretofore-known devices of this general type and that reduces the space requirement of the fuse links.

With the foregoing and other objects in view, there is provided, in accordance with the invention, an integrated circuit, including electrical conductor tracks adjacently disposed parallel to one another and running substantially in a first direction, the electrical conductor tracks respectively having electrical connection points configured to be severed by application of energy, the connection points disposed offset with respect to one another both in the first direction and in a second direction at right angles to the first direction, the conductor tracks having an offset facing away from a respective adjacent one of the conductor tracks at a level of one of the connection points of the respective adjacent one of the conductor tracks to form a smaller spacing between two adjacent ones of the conductor tracks in the second direction in each case where adjacent ones of the conductor tracks do not have a connection point than where adjacent ones of the conductor tracks has a connection point.

The integrated circuit according to the invention has electrical connection points that can be severed by the application or action of energy and which, as viewed both in a first direction and in a second direction at right angles thereto, are disposed offset with respect to one another. The connection points are respectively a constituent part of an electrical conductor track, are disposed parallel to one another, and run substantially in the first direction. The conductor tracks have, at the level of the connection point of the respectively adjacent conductor track, an offset facing away from the latter, so that in each case where they do not have a connection point, two adjacent conductor tracks have a smaller spacing from one another in the second direction than where one of the adjacent conductor tracks has a connection point.

The invention has the advantage that, through the offsets of the conductor tracks provided at the level of the respectively adjacent connection point, the respectively predefined minimum spacing can be complied with at these points without difficulty to avoid short circuits between the conductor tracks that can result from the connection point severing. Likewise, it is, therefore, more easily to comply with the minimum spacing necessitated by the laser system. At the same time, a relatively high packing density of the connection points results because in each case two of the conductor tracks, in the regions in which neither of them has a connection point, have a distinctly smaller spacing from one another than in the regions in which one of them has a connection point. In other words, the conductor tracks have the minimum spacing needed to avoid a short circuit only where the risk of a short circuit actually exists, while in noncritical regions, with respect to a short circuit, the spacing can fall distinctly below the minimum, and it is necessary to take account only of the conventional configuration rules relating to the conductor track spacings on the integrated circuit. Further, a larger beam diameter can be used for the laser process and slight mispositioning of the laser system is less critical.

In accordance with another feature of the invention, the integrated circuit has at least one central and two outer electrical connection points that can be severed by the action of energy. The central connection point, as viewed both in a first direction and in a second direction at right angles thereto, is disposed between the two outer connection points. The connection points are in each case a constituent part of a central or of an outer electrical conductor track. The points are disposed parallel to one another and run substantially in the first direction. Each outer conductor track has, at the level of the central connection point, an offset facing away from the latter and, at the level of the outer connection point of the respective other outer conductor track, an offset facing the latter. The central conductor track has, at the level of the two outer connection points, in each case an offset facing away from the latter.

In accordance with a further feature of the invention, the connection points include multiples of the central and two outer electrical connection points; and the multiples are disposed adjacent to one another in the second direction.

In accordance with a concomitant feature of the invention, there are provided a first metallization plane and a second metallization plane, the central and the two outer conductor tracks being a constituent part of the first metallization plane in a region of a respective one of the central and the two outer connection points, and the central and the two outer conductor tracks being a constituent part of the second metallization plane in a region of others of the connection points.

The development of the invention provides the significant advantage of saving space. In addition, multiples of the above-described configuration, respectively having three connection points and corresponding conductor tracks in the second direction at right angles to the course of the conductor tracks, can be disposed adjacent to one another. As such, an overall configuration optimized with respect to the space requirement is produced in each case.

Other features that are considered as characteristic for the invention are set forth in the appended claims.

Although the invention is illustrated and described herein as embodied in an integrated circuit with electrical connection points that can be severed by the action of energy, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIGS. 1 to 3 are diagrammatic plan views of various different exemplary embodiments of the invention; and FIG. 4 is a diagrammatic cross-sectional view of one of the embodiments of FIGS. 1 to 3.

DESCRIPTION OF THE PREFERRED EMBODIMENTS

Figure 1:
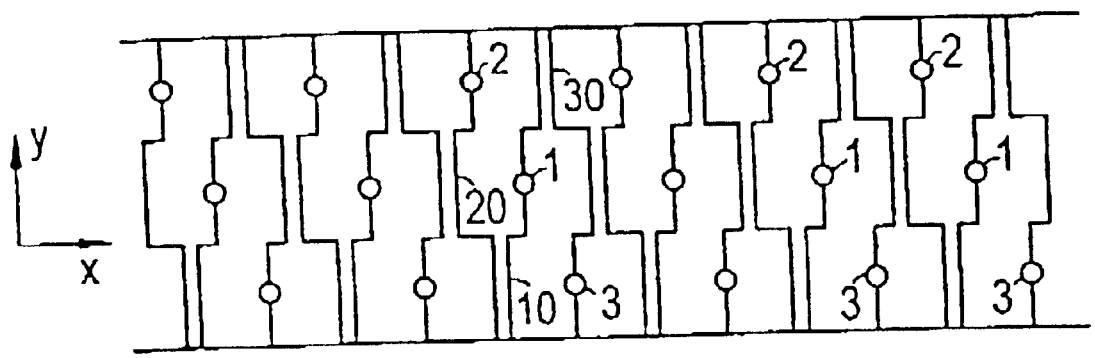

In all the figures of the drawing, sub-features and integral parts that correspond to one another bear the same reference symbol in each case.

Referring now to the figures of the drawings in detail and first, particularly to FIG. 1 thereof, there is shown three rows of electrical connection points that can be severed by the action of energy (fuse links). The connection points of the embodiment can be severed by a laser. In other embodiments of the invention, the severing action can also be carried out in any other way, for example, electrically, by supplying a sufficiently high current. The following text discusses the three fuse links in the center of FIG. 1, which shows a central fuse link 1 and two outer fuse links 2, 3 respectively disposed offset with respect to one another in the X direction and in the Y direction. The central fuse link 1 is a constituent part of a central conductor track 10, and the outer fuse links 2, 3 are each constituent parts of an outer conductor track 20, 30. The conductor tracks 10, 20, 30 are disposed parallel to one another and run substantially in the Y direction. The conductor tracks do not run rectilinearly but have offsets that, in the regions in which the respective adjacent conductor track has a fuse link, face away from the fuse link and, in the regions in which the adjacent conductor track has no fuse link, face the fuse link. The configuration results in a distinctly greater spacing between adjacent conductor tracks in the regions in which there is a fuse link than where two adjacent conductor tracks have no fuse link. At the last-named points, the minimum spacing between the conductor tracks can be based on the construction rules generally applicable to the respective integrated circuit. In the regions of the fuse links, the mutual spacing of the conductor tracks is based on the respectively applicable minimum spacing, which has to be complied with to avoid short circuits caused by fuse link severing and the associated distribution of fuse link material on the surface of the integrated circuit. In the Y direction, the offsets of the conductor tracks have a specific minimum length so that the necessary minimum spacing is ensured over a larger area around the respective adjacent fuse link.

FIG. 1 reveals that the integrated circuit of the first embodiment has a plurality of the configurations just described, each having three fuse links 1, 2, 3 and corresponding conductor tracks 10, 20, 30 that, in the X direction, are respectively disposed adjacent to one another, resulting in a regularly repeating structure. It is clear that a high packing density of the fuse links is, therefore, achieved.

The conductor tracks 10, 20, 30 in FIG. 1 have only conductor-track sections as straight lines, so that the offsets are bent at right angles. In other embodiments of the invention, however, it is also possible for the conductor tracks to be made of rounded conductor-track sections.

Figure 2:
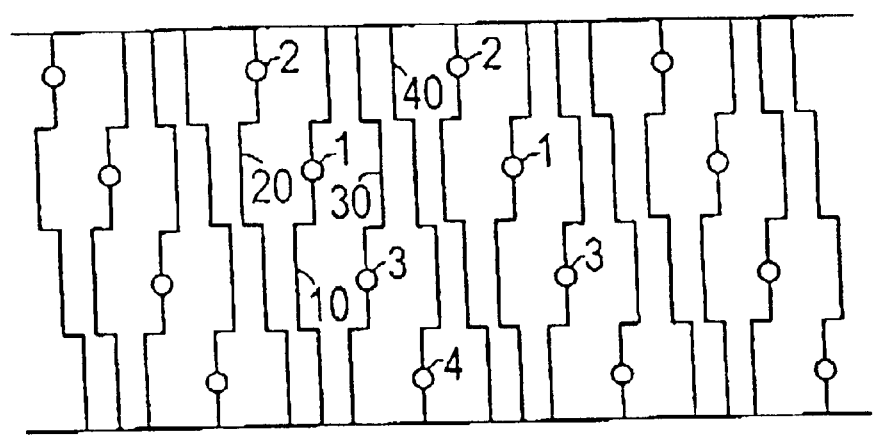

FIG. 2 illustrates a second embodiment of the invention in which, once again, the minimum configuration already described using FIG. 1, in each case of three fuse links 1, 2, 3, is contained many times. As opposed to FIG. 1, the fuse links of FIG. 2 are disposed in four rows rather than in three rows.

Thus, in each case between two minimum configurations of the three connection points 1, 2, 3 adjacent to one another in the X direction, there is a further conductor track 40 with a fourth connection point 4. Therefore, in FIG. 2, as well, the respective three fuse links 1, 2, 3 of the minimum configuration are disposed adjacent to one another in the X direction but not directly. Rather, they are separated from one another by the further conductor track 40. The result is once more an extremely dense packing density of the fuse links 1, 2, 3, 4.

FIG. 3 illustrates a further embodiment of the invention with five rows of fuse links 1, 2, 3, 4, 5. The minimum configurations of the respective three fuse links 1, 2, 3, once more adjacent in the X direction, are separated from one another by two further conductor tracks 40, 50. Each of the two further conductor tracks 40, 50 has a further fuse link 4, 5.

FIG. 4 illustrates a cross-section through the integrated circuit IC of any one of the embodiments of FIGS. 1 to 3. Here, only a detail of the cross section is illustrated, and shows the central conductor track 10 and the two outer conductor tracks 20, 30 of the minimum configuration.

FIG. 4 shows two metallization planes M1, M2 separated from each other by a dielectric insulating layer I and belonging to the integrated circuit IC. The cross-section illustrated runs in the X direction through the central fuse link 1 in FIGS. 1 to 3. It can be seen that, in the region of the central fuse link 1, the central conductor track 10 runs in the first metallization plane Ml, while, in the region of the central fuse link 1, the two outer conductor tracks 20, 30 run in the second metallization plane M2. At the level of the outer fuse links 2, 3 (not illustrated in FIG. 4), the corresponding outer conductor track 20, 30 runs in the first metallization plane M1, and the two other conductor tracks run in the second metallization plane M2. By leading the conductor tracks 10, 20, 30 in different metallization planes M1, M2, it is not so easy for short circuits with the respectively adjacent conductor tracks to occur when the fuse links 1, 2, 3 are severed because the insulating layer I present between the metallization planes is destroyed only locally by the severing process. The insulating layer I continues to cover the conductor tracks, thus, maintaining the minimum spacing with respect to the fuse link.

In contrast to FIG. 4, in other embodiments of the invention, all the segments of the conductor tracks 10, 20, 30 run in a common metallization plane.

We claim:

1. An integrated circuit, comprising:

electrical conductor tracks adjacently disposed parallel to one another and running substantially in a first direction, said electrical conductor tracks respectively having electrical connection points configured to be severed by application of energy, said connection points disposed offset with respect to one another both in said first direction and in a second direction at right angles to said first direction, said conductor tracks having an offset facing away from a respective adjacent one of said conductor tracks at a level of one of said connection points of said respective adjacent one of said conductor tracks to form a smaller spacing between two adjacent ones of said conductor tracks in said second direction in each case where adjacent ones of said conductor tracks do not have a connection point than where adjacent ones of said conductor tracks has a connection point.

2. The integrated circuit according to claim 1, wherein:

said connection points include a central electrical connection point and two outer electrical connection points;

said central connection point is disposed between said two outer connection points both in said first direction and in said second direction;

said conductor tracks include a central conductor track and two outer conductor tracks;

said central conductor track and said two outer conductor tracks are disposed parallel to one another and run substantially in said first direction;

each of said central connection point and said two outer connection points are respectively a constituent part of one of said central and said two outer conductor tracks;

each of said two outer conductor tracks has an offset facing away from said central connection point at a level of said central connection point, and an offset facing said central connection point at a level of a respective one of said two outer connection points of each of said two outer conductor tracks; and said central conductor track has a respective offset facing away from said central conductor track at a level of said two outer connection points.

3. The integrated circuit according to claim 2, wherein:

said connection points include multiples of said central and two outer electrical connection points; and said multiples are disposed adjacent to one another in said second direction.

4. The integrated circuit according to claim 2, including a first metallization plane and a second metallization plane, said central and said two outer conductor tracks being a constituent part of said first metallization plane in a region of a respective one of said central and said two outer connection points, and said central and said two outer conductor tracks being a constituent part of said second metallization plane in a region of others of said connection points.

5. The integrated circuit according to claim 3, including a first metallization plane and a second metallization plane, said central and said two outer conductor tracks being a constituent part of said first metallization plane in a region of a respective one of said central and said two outer connection points, and said central and said two outer conductor tracks being a constituent part of said second metallization plane in a region of others of said connection points.

* * * * *